(12) United States Patent
Bober

(10) Patent No.: US 10,978,751 B2
(45) Date of Patent: Apr. 13, 2021

(54) BATTERY SYSTEM

(71) Applicant: LG Chem, Ltd., Seoul (KR)

(72) Inventor: Greg Bober, Saint Clair Shores, MI (US)

(73) Assignee: LG Chem, Ltd., Seoul (KR)

( * ) Notice: Subject to any disclaimer, the term of this patent is extended or adjusted under 35 U.S.C. 154(b) by 231 days.

(21) Appl. No.: 16/352,095

(22) Filed: Mar. 13, 2019

(65) Prior Publication Data

US 2020/0295407 A1 Sep. 17, 2020

(51) Int. Cl.
| | |
|---|---|
| *H01M 10/42* | (2006.01) |
| *H01M 2/20* | (2006.01) |
| *G01R 31/382* | (2019.01) |
| *G01R 31/371* | (2019.01) |
| *G01R 19/165* | (2006.01) |
| *H02J 7/00* | (2006.01) |
| *H01M 50/502* | (2021.01) |

(52) U.S. Cl.
CPC .... *H01M 10/425* (2013.01); *G01R 19/16542* (2013.01); *G01R 31/371* (2019.01); *G01R 31/382* (2019.01); *H01M 50/502* (2021.01); *H02J 7/0019* (2013.01); *H01M 2010/4271* (2013.01); *H01M 2010/4278* (2013.01); *H01M 2220/20* (2013.01)

(58) Field of Classification Search
CPC ............ H01M 10/425; H01M 2/206; H01M 2010/4278; H01M 2220/20; H01M 2010/427; G01R 31/382; G01R 31/371; G01R 10/16542; H02J 7/0019

USPC .................................................. 320/134
See application file for complete search history.

(56) References Cited

U.S. PATENT DOCUMENTS

| | | | | |
|---|---|---|---|---|
| 8,570,047 | B1 * | 10/2013 | Davies et al. .... | H01M 10/4207 324/434 |
| 8,896,315 | B1 * | 11/2014 | Davies .................. | H02J 7/0019 324/434 |
| 9,112,216 | B2 | 8/2015 | Park | |
| 9,450,274 | B2 * | 9/2016 | Vo et al. ................ | H02J 7/0016 |
| 9,876,369 | B2 * | 1/2018 | McCormick et al. ....................... H02J 7/0014 |
| 9,893,385 | B1 * | 2/2018 | Nayar et al. ......... | H01M 10/486 |
| 10,063,068 | B1 | 8/2018 | McCormick | |
| 10,074,997 | B2 * | 9/2018 | Vo et al. ................. | H02J 7/342 |

FOREIGN PATENT DOCUMENTS

| | | |
|---|---|---|
| KR | 20140055065 A | 5/2014 |
| KR | 101655377 B1 | 9/2016 |

\* cited by examiner

*Primary Examiner* — Sun J Lin
(74) *Attorney, Agent, or Firm* — Buckert Patent & Trademark Law Firm PC; John F. Buckert

(57) ABSTRACT

A battery system has a first cell balancing circuit and a second cell balancing circuit with a bus bar disposed therebetween. The battery system further includes an integrated circuit measuring a first voltage between two sense lines coupled to opposite ends of the bus bar while the first cell balancing circuit and a second cell balancing circuit are turned off, and determining a voltage value based on the first voltage. A microcontroller receives the voltage value and determines that an open circuit condition exists in the bus bar if the voltage value is greater than a threshold voltage value.

10 Claims, 3 Drawing Sheets

BATTERY SYSTEM

BACKGROUND

A bus bar may be utilized to electrically couple a first cell balancing circuit to a second balancing circuit. The inventor herein has recognized a need for an improved battery system that detects when an open circuit condition undesirably exists in the bus bar between first and second cell balancing circuits.

SUMMARY

A battery system in accordance with an exemplary embodiment is provided. The battery system includes a first cell balancing circuit electrically coupled to first and second sense lines and to first and second electrical terminals of a first battery cell. The first cell balancing circuit has a first transistor electrically coupled in parallel to the first battery cell. The battery system further includes a second cell balancing circuit electrically coupled to third and fourth sense lines and to first and second electrical terminals of a second battery cell. The second cell balancing circuit has a second transistor electrically coupled in parallel to the second battery cell. The battery system further includes a bus bar electrically coupled between the second terminal of the first battery cell and the first terminal of the second battery cell. A first end of the bus bar is electrically coupled to the second sense line, and a second end of the bus bar is electrically coupled to the third sense line. The battery system further includes a microcontroller commanding each of the first and second transistors to transition to an open operational state such that the first and second balancing circuits, respectively, are turned off. The battery system further includes an integrated circuit measuring a first voltage between the second and third sense lines while the first and second cell balancing circuits are turned off, and determining a voltage value based on the first voltage. The microcontroller receives the voltage value and determines that an open circuit condition exists in the bus bar if the voltage value is greater than a threshold voltage value.

DETAILED DESCRIPTION

Figure 1:
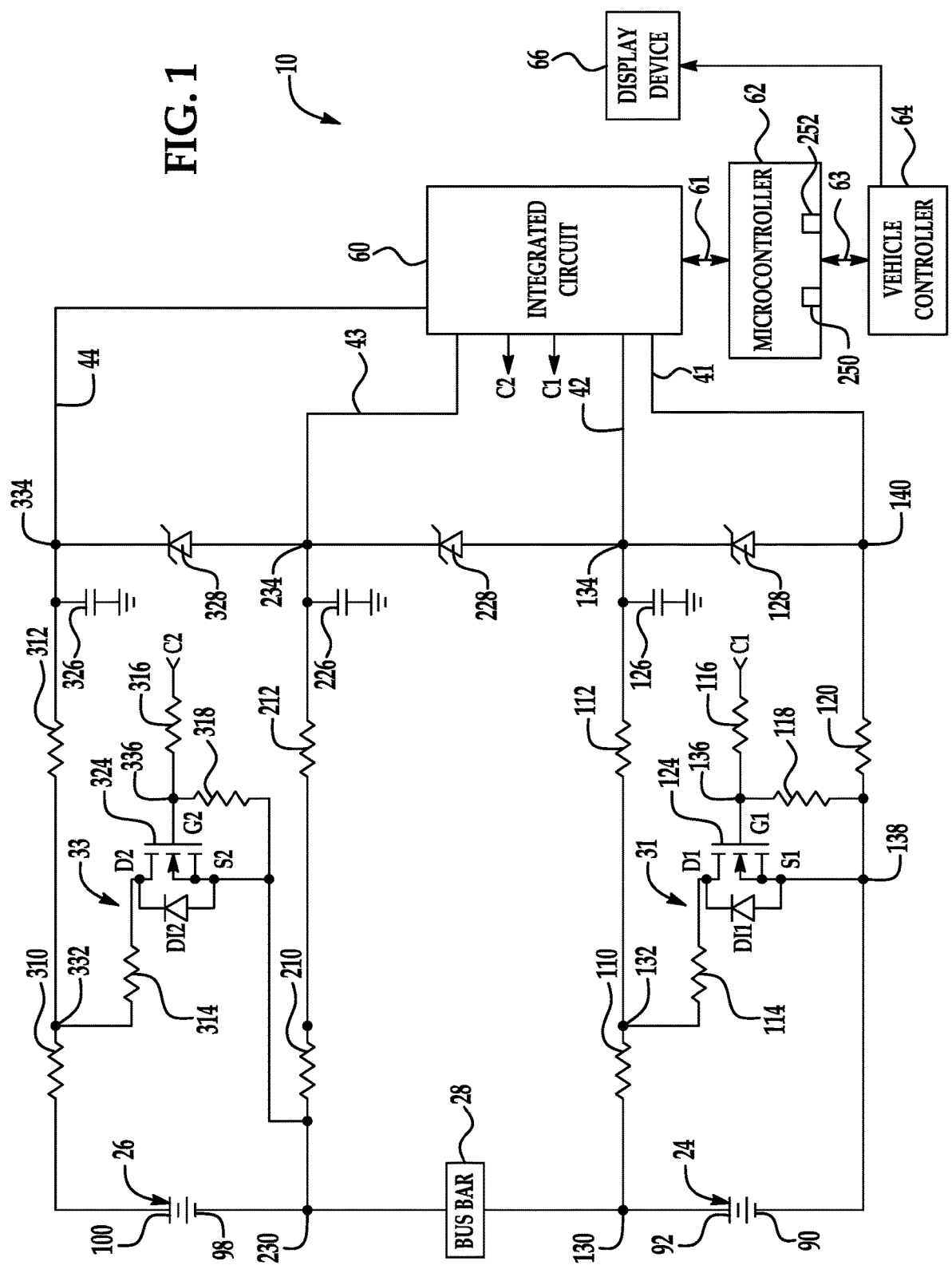
FIG. 1 is a schematic of a battery system in accordance with an exemplary embodiment.

Referring to FIG. 1, a battery system 10 in accordance with an exemplary embodiment is provided. The battery system 10 includes first and second battery cells 24, 26, a bus bar 28, a first cell balancing circuit 31, a second cell balancing circuit 33, a first sense line 41, a second sense line 42, a third sense line 43, a fourth sense line 44, an integrated circuit 60, a communication bus 61, a microcontroller 62, a communication bus 63, a vehicle controller 64, and a display device 66.

An advantage of the battery system 10 is that the microcontroller 62 detects when an open circuit condition undesirably exists in the bus bar 28 between first and second cell balancing circuits 31, 33.

The first battery cell 24 and the second battery cell 26 are electrically coupled in series with one another via the bus bar 28.

The first battery cell 24 includes a first electrical terminal 90 and a second electrical terminal 92. In an exemplary embodiment, the first battery cell 24 is a pouch-type lithium-ion battery cell. In an alternative embodiment, the first battery cell 24 is another type of battery cell known to those skilled in the art. The first battery cell 24 is electrically coupled to the first cell balancing circuit 31.

The second battery cell 26 includes a first electrical terminal 98 and a second electrical terminal 100. In an exemplary embodiment, the second battery cell 26 is a pouch-type lithium-ion battery cell. In an alternative embodiment, the second battery cell 26 is another type of battery cell known to those skilled in the art. The second battery cell 26 is electrically coupled to the second balancing circuit 33.

The first cell balancing circuit 31 is adapted to selectively discharge an electrical current from the first battery cell 24. The first cell balancing circuit 31 includes resistors 110, 112, 114, 116, 118, 120, a transistor 124, a capacitor 126, a Zener diode 128, and electrical nodes 130, 132, 134, 136, 138, 140.

The resistor 110 is electrically coupled to the electrical node 130 (and to the second electrical terminal 92 of the first battery cell 24) and to the electrical node 132. In an exemplary embodiment, the resistor 110 has a resistance of 2 ohms. The resistor 114 is electrically coupled to and between the electrical node 132 and the drain D1 of the transistor 124.

The transistor 124 is adapted to control a balancing electrical current from the first battery cell 24. The transistor 124 includes a gate terminal G1, the drain terminal D1, a source terminal S1, and an internal diode DI1.

The drain terminal D1 is electrically coupled to the resistor 114. The source terminal S1 is electrically coupled to the electrical node 138, and the electrical node 138 is electrically coupled to the first electrical terminal 90 of the first battery cell 24. The gate terminal G1 is electrically coupled to the electrical node 136.

The resistor 116 is electrically coupled to and between the electrical node 136 and to the integrated circuit 60. Further, the resistor 118 is electrically coupled to and between the electrical node 136 and electrical node 138, and is electrically coupled in parallel between the gate terminal G1 and the source terminal S1 of the transistor 124.

The resistor 120 is electrically coupled to and between the electrical node 138 and the electrical node 140. The electrical node 140 is further electrically coupled through the first sense line 41 to the integrated circuit 60.

The resistor 112 is electrically coupled to and between the electrical node 132 and an electrical node 134. The electrical node 134 is further electrically coupled through the second sense line 42 to the integrated circuit 60. The capacitor 126 is coupled to and between the electrical node 134 and electrical ground. Further, the Zener diode 128 is coupled to and between the electrical node 134 and the electrical node 140, and is electrically coupled between the sense lines 41, 42.

To perform battery cell balancing of battery cell 24, the microcontroller 62 sends a command message to the integrated circuit 60, and in response the integrated circuit 60 generates the control signal C1 having a high logic level that is divided by the resistors 116, 118 and is thereafter applied to the transistor 124. In response to the control signal C1 having the high logic level, the transistor 124 turns on which allows an electrical current to flow through the resistor 110, and the resistor 114, and the transistor 124 to at least partially discharge the battery cell 24.

To stop the battery cell balancing of battery cell 24, the microcontroller 62 sends another command message to the integrated circuit 60, and in response the integrated circuit 60 generates the control signal C1 having a low logic level that is divided by the resistors 116, 118 and is thereafter applied to the transistor 124. In response to the control signal C1 having the low logic level, the transistor 124 turns off which stops the flow of the electrical current through the resistor 110, and the resistor 114, and the transistor 124, and turns off the first cell balancing circuit 31.

The second cell balancing circuit 33 is adapted to selectively discharge an electrical current from the second battery cell 26. The second cell balancing circuit 33 includes resistors 310, 312, 314, 316, 318, 212, 210, a transistor 324, a capacitor 326, a Zener diode 328, and electrical nodes 332, 334, 336, 230, 234.

The resistor 310 is electrically coupled to the electrical node 332 and to the second electrical terminal 100 of the battery cell 26. In an exemplary embodiment, the resistor 310 has a resistance of 2 ohms. The resistor 314 is electrically coupled to and between the electrical node 332 and the drain D2 of the transistor 324.

The transistor 324 is adapted to control a balancing electrical current from the second battery cell 26. The transistor 324 includes a gate terminal G2, a drain terminal D2, a source terminal S2, and an internal diode D12.

The drain terminal D2 is electrically coupled to the resistor 314. The source terminal S2 is electrically coupled to the electrical node 230, and the electrical node 230 is electrically coupled to the first electrical terminal 98 of the second battery cell 26. The gate terminal G2 is electrically coupled to the electrical node 336.

The resistor 316 is electrically coupled to and between the electrical node 336 and to the integrated circuit 60. Further, the resistor 318 is electrically coupled to and between the electrical node 336 and electrical node 230, and is electrically coupled in parallel between the gate terminal G2 and the source terminal S2 of the transistor 324.

The resistor 312 is electrically coupled to and between the electrical node 332 and an electrical node 334. The electrical node 334 is further electrically coupled through the fourth sense line 44 to the integrated circuit 60. The capacitor 326 is coupled to and between the electrical node 334 and electrical ground. Further, the Zener diode 328 is coupled to and between the electrical node 334 and the electrical node 234, and is electrically coupled between the third and fourth sense lines 43, 44.

To perform battery cell balancing of battery cell 26, the microcontroller 62 sends a command message to the integrated circuit 60 to induce the integrated circuit 60 to generate the control signal C2 having a high logic level that is divided by the resistors 316, 318 and is thereafter applied to the transistor 324, and in response the transistor 324 turns on which allows an electrical current to flow through the resistor 310, and the resistor 314, and the transistor 324 to at least partially discharge the battery cell 26.

To stop the battery cell balancing of battery cell 26, the microcontroller 62 sends another command message to the integrated circuit 60, and in response the integrated circuit 60 generates the control signal C2 having a low logic level that is divided by the resistors 316, 318 and is thereafter applied to the transistor 324. In response to the control signal C2 having the low logic level, the transistor 324 turns off which stops the flow of the electrical current through the resistor 310, and the resistor 314, and the transistor 324, and turns off the second cell balancing circuit 33.

The first and second sense lines 41, 42 are utilized by the integrated circuit 60 to measure a voltage output by the battery cell 24. The first sense line 41 is electrically coupled to and between the electrical node 140 and the integrated circuit 60. Further, the second sense line 42 is electrically coupled to and between the electrical node 134 and the integrated circuit 60.

The second and third sense lines 42, 43 are utilized by the integrated circuit 60 to measure a voltage across the bus bar 28 to detect an open circuit condition in the bus bar 28. If the voltage across the bus bar 28 is greater than a threshold voltage level, an open circuit condition undesirably exists in the bus bar 28. In an exemplary embodiment, the threshold voltage level is in a range of 500 millivolts to 1500 millivolts. As discussed above, the second sense line 42 is electrically coupled to and between the electrical node 134 and the integrated circuit 60. The third sense line 43 is electrically coupled to and between the electrical node 234 and the integrated circuit 60.

The third and fourth sense lines 43, 44 are utilized by the integrated circuit 60 to measure a voltage output by the battery cell 26. As discussed above, the third sense line 43 is electrically coupled to and between the electrical node 234 and the integrated circuit 60. The fourth sense line 44 is electrically coupled to and between the electrical node 334 and the integrated circuit 60.

The integrated circuit 60 is electrically coupled to the first, second, third, and fourth sense lines 41, 42, 43, 44 and to the resistors 116, 316. The integrated circuit 60 operably communicates with the microcontroller 62 utilizing a communication bus 61. The integrated circuit 60 measures a voltage between the first and second sense lines 41, 42 and sends an associated voltage value indicating a voltage of the battery cell 24 to the microcontroller 62. Further, the integrated circuit 60 measures a voltage between the second and third sense lines 42, 43 and sends an associated voltage value indicating a voltage across the bus bar 28 to microcontroller 26. Further, the integrated circuit 60 measures a voltage between the third and fourth sense lines 43, 44 and sends an associated voltage value indicating a voltage across the battery cell 26 to the microcontroller 62.

The microcontroller 62 generates command messages to induce the integrated circuit 60 to turn on and to turn off the transistors 124, 334 in the first and second balancing circuits 31, 33, respectively.

The microcontroller 62 can detect an open circuit fault conditions in the bus bar 28 based on the voltage across the sense lines 42, 43 and generate an associated open circuit diagnostic code that is sent to the vehicle controller 64, as will be explained in greater detail below. The microcontroller 62 includes a microprocessor 250 and a memory device 252. The microprocessor 250 is programmed to execute a software program stored in the memory device 252 to implement at least a portion of the operational steps associated with the microprocessor 250 that will be described hereinafter. The microcontroller 62 operably communicates with the integrated circuit 60 utilizing the communication bus 61. Also, the microcontroller 62 operably communicates with the vehicle controller 64 utilizing the communication bus 63.

Figure 2:
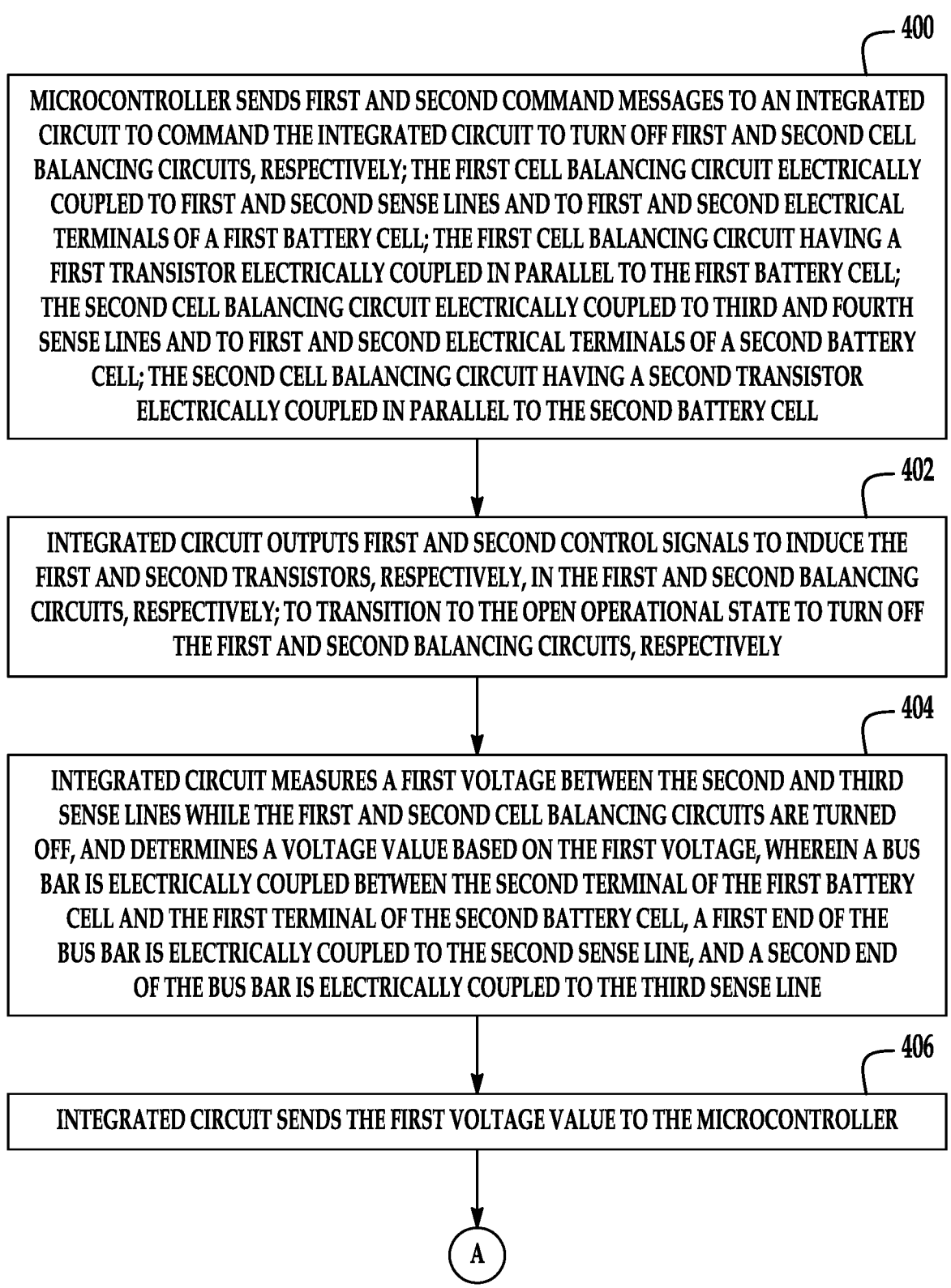
FIGS. 2-3 are flowcharts of a method for determining an open circuit condition in a bus bar within the battery system of FIG. 1 in accordance with another exemplary embodiment.
Figure 3:
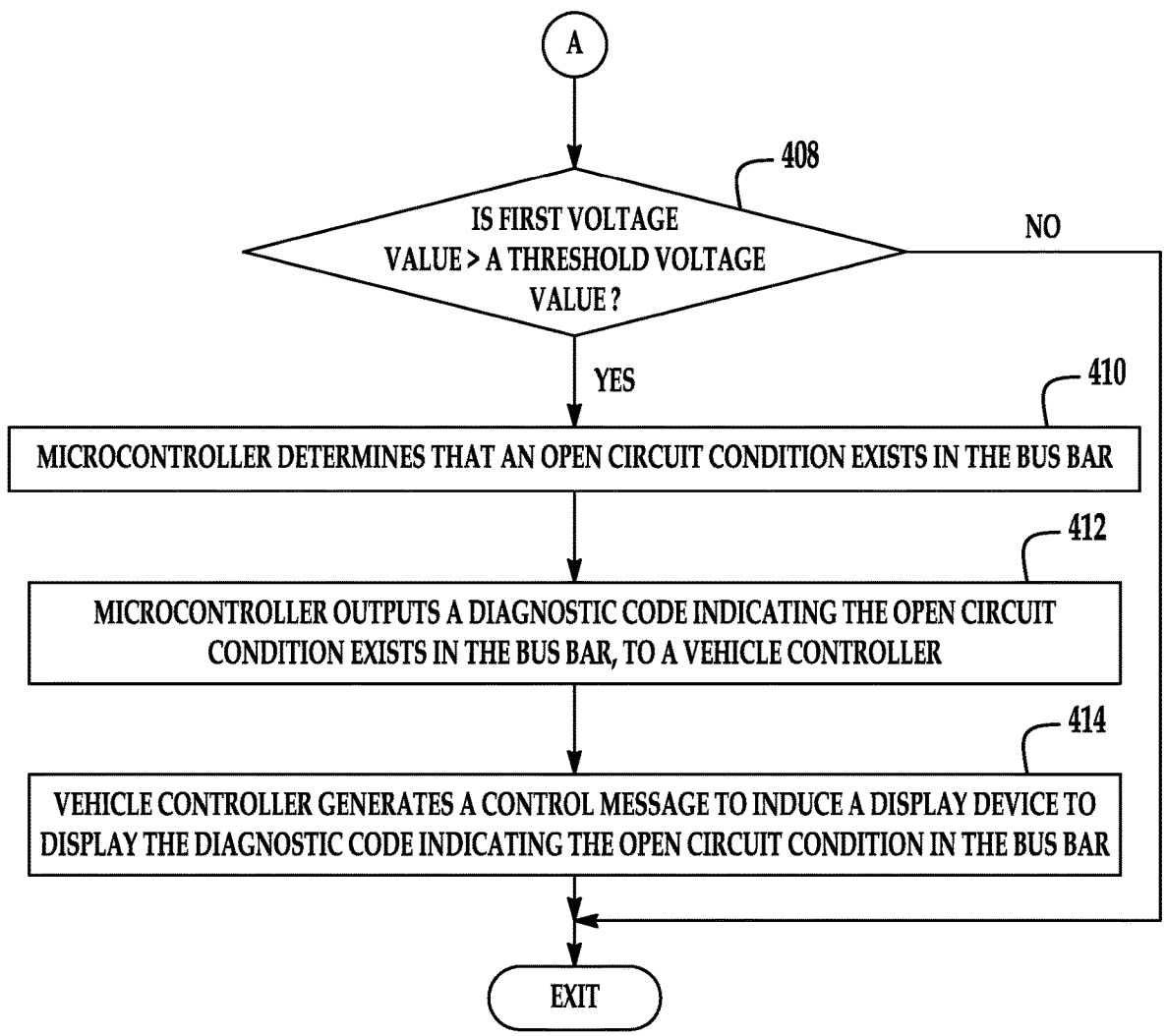

Referring to FIGS. 1-3, a flowchart of a diagnostic method for detecting an open circuit condition in the bus bar 28 of the battery system 10 in accordance with another exemplary embodiment will be explained.

At step 400, the microcontroller 62 sends first and second command messages to an integrated circuit 60 to command the integrated circuit 60 to turn off first and second cell balancing circuits 31, 33, respectively. The first cell balancing circuit 31 is electrically coupled to first and second sense lines 41, 42 and to first and second electrical terminals 90, 92 of a first battery cell 24. The first cell balancing circuit 31 has a first transistor 124 that is electrically coupled in parallel to the first battery cell 24. The second cell balancing circuit 33 is electrically coupled to third and fourth sense lines 42, 43 and to first and second electrical terminals 98, 100 of a second battery cell 26. The second cell balancing circuit 33 has a second transistor 324 that is electrically coupled in parallel to the second battery cell 26. After step 400, the method advances to step 402.

At step 402, the integrated circuit 60 outputs first and second control signals to induce the first and second transistors 124, 324, respectively, in the first and second balancing circuits 31, 33, respectively, to transition to the open operational state to turn off the first and second balancing circuits 31, 33, respectively. After step 402, the method advances to step 404.

At step 404, the integrated circuit 60 measures a first voltage between the second and third sense lines 42, 43 and while the first and second cell balancing circuits 31, 33 are turned off, and determines a voltage value based on the first voltage, wherein a bus bar 28 is electrically coupled between the second terminal 92 of the first battery cell 24 and the first terminal 98 of the second battery cell 26, a first end (e.g., node 130) of the bus bar 28 is electrically coupled to the second sense line 42, and a second end (e.g., node 230) of the bus bar 28 is electrically coupled to the third sense line 43. After step 404, the method advances to step 406.

At step 406, the integrated circuit 60 sends the first voltage value to the microcontroller 62. After step 406, the method advances to step 408.

At step 408, the microcontroller 62 makes a determination as to whether the first voltage value is greater than a threshold voltage value. If the value of step 408 equals "yes", the method advances to step 410. Otherwise, the method is exited.

At step 410, the microcontroller 62 determines that an open circuit condition exists in the bus bar 28. After step 410, the method advances to step 412.

At step 412, the microcontroller 62 outputs a diagnostic code indicating the open circuit condition exists in the bus bar 28, to a vehicle controller 64. After step 412, the method advances to step 414.

At step 414, the vehicle controller 64 generates a control message to induce a display device 66 to display the diagnostic code indicating the open circuit condition in the bus bar 28. After step 414, the method is exited.

The above-described method can be at least partially embodied in the form of one or more memory devices or computer readable media having computer-executable instructions for practicing the method. The memory device can comprise one or more of the following: hard drives, RAM memory, flash memory, and other computer-readable media known to those skilled in the art; wherein, when the computer-executable instructions are loaded into and executed by one or more microcontrollers or processors, the one or more microcontrollers or processors become an apparatus programmed to practice the associated steps of the method.

The battery system described herein provides a substantial advantage over other battery systems. In particular, the battery system has a technical effect of utilizing a microcontroller that detects when an open circuit condition exists in a bus bar between first and second cell balancing circuits.

While the claimed invention has been described in detail in connection with only a limited number of embodiments, it should be readily understood that the invention is not limited to such disclosed embodiments. Rather, the claimed invention can be modified to incorporate any number of variations, alterations, substitutions or equivalent arrangements not heretofore described, but which are commensurate with the spirit and scope of the invention. Additionally, while various embodiments of the claimed invention have been described, it is to be understood that aspects of the invention may include only some of the described embodiments. Accordingly, the claimed invention is not to be seen as limited by the foregoing description.

What is claimed is:

1. A battery system, comprising:
    a first cell balancing circuit electrically coupled to first sense line and a second sense line and to a first electrical terminal and a second electrical terminal of a first battery the first cell, balancing circuit having a first transistor electrically coupled in parallel to the first battery cell;
    a second cell balancing circuit electrically coupled to a third sense line and a fourth sense line and to a first electrical terminal and a second electrical terminal of a second battery cell, the second cell balancing circuit having a second transistor electrically coupled in parallel to the second battery cell;
    a bus bar electrically coupled between the second electrical terminal of the first battery cell and the first electrical terminal of the second battery cell, a first end of the bus bar being electrically coupled to the second sense line, and a second end of the bus bar being electrically coupled to the third sense line;
    a microcontroller commanding each of the first transistor and the second transistor to transition to an open operational state such that the first balancing circuit and the second balancing circuit are turned off, respectively; and
    an integrated circuit measuring a first voltage between the second sense line and the third sense line while the first balancing circuit and the second balancing circuit are turned off, and determining a voltage value based on the first voltage, wherein
    the microcontroller receiving the voltage value and determining that an open circuit condition exists in the bus bar if the voltage value is greater than a threshold voltage value.

2. The battery system of claim 1, wherein the second electrical terminal of the first battery cell being electrically coupled in series with the second sense line, and the first electrical terminal of the second battery cell being electrically coupled in series with the third sense line.

3. The battery system of claim 2, wherein the integrated circuit is electrically coupled to the second sense line and the third sense line and to the microcontroller.

4. The battery system of claim 1, wherein:
    the microcontroller commanding the first transistor to transition to the open operational state by sending a first command message to the integrated circuit; and
    the integrated circuit outputting a first control signal to induce the first transistor to transition to the open operational state, in response to the first command message.

5. The battery system of claim 4, wherein:
the microcontroller commanding the second transistor to transition to the open operational state by sending a second command message to the integrated circuit; and
the integrated circuit outputting a second control signal to induce the second transistor to transition to the open operational state, in response to the second command message.

6. The battery system of claim 1, further comprising a first Zener diode electrically coupled to the second sense line and the third sense line.

7. The battery system of claim 6, further comprising a second Zener diode electrically coupled to the first sense line and the second sense line, and a third Zener diode electrically coupled to the third sense line and the fourth sense line.

8. The battery system of claim 1, wherein the threshold voltage value is in a range of 500 millivolts to 1500 millivolts.

9. The battery system of claim 1, wherein the microcontroller outputs a diagnostic code indicating the open circuit condition exists in the bus bar, to a vehicle controller.

10. The battery system of claim 9, wherein the vehicle controller generates a control message to induce a display device to display the diagnostic code.

* * * * *